United States Patent
Caywood

(12)
(10) Patent No.: US 6,411,545 B1
(45) Date of Patent: Jun. 25, 2002

(54) NON-VOLATILE LATCH

(75) Inventor: John Caywood, Sunnyvale, CA (US)

(73) Assignee: John Millard and Pamela Ann Caywood 1989 Revokable Living Trust, Sunnyvale, CA (US)

( * ) Notice: Subject to any disclaimer, the term of this patent is extended or adjusted under 35 U.S.C. 154(b) by 0 days.

(21) Appl. No.: 09/713,635

(22) Filed: Nov. 14, 2000

Related U.S. Application Data

(60) Provisional application No. 60/166,593, filed on Nov. 19, 1999.

(51) Int. Cl.[7] ................................................ G11C 16/04
(52) U.S. Cl. ................................... 365/185.07; 365/156
(58) Field of Search ....................... 365/185.07, 185.05, 365/189.05, 154, 156

(56) References Cited

U.S. PATENT DOCUMENTS 4,348,745 A * 9/1982 Schmitz ....................... 365/154
5,648,930 A * 7/1997 Randazzo .............. 365/185.07
5,986,932 A * 11/1999 Ratnakumar et al. .. 365/185.07

* cited by examiner

Primary Examiner—Vu A. Le
(74) Attorney, Agent, or Firm—Sierra Patent Group, Ltd.

(57) ABSTRACT

A non-volatile latch comprises first and second read/write bias nodes and first and second a complementary output nodes. First and second first conductivity type MOS transistors have sources coupled to a first voltage potential. A drain of the first MOS transistor is coupled to the first complementary output node and a drain of the second MOS transistor is coupled to the second complementary output node. Each of the first and second MOS transistors have a gate cross coupled to the drain of the other one of the first and second MOS transistor. A source of a third MOS transistor is coupled to the first read/write bias node and a source of a fourth MOS transistor is coupled to the second read/write bias node. A drain of the third MOS transistor is coupled to the first complementary output node and a drain of the fourth MOS transistor is coupled to the second complementary output node. Each of the third and fourth MOS transistors have a gate cross coupled to the source of the other one of the third and fourth MOS transistors.

5 Claims, 6 Drawing Sheets

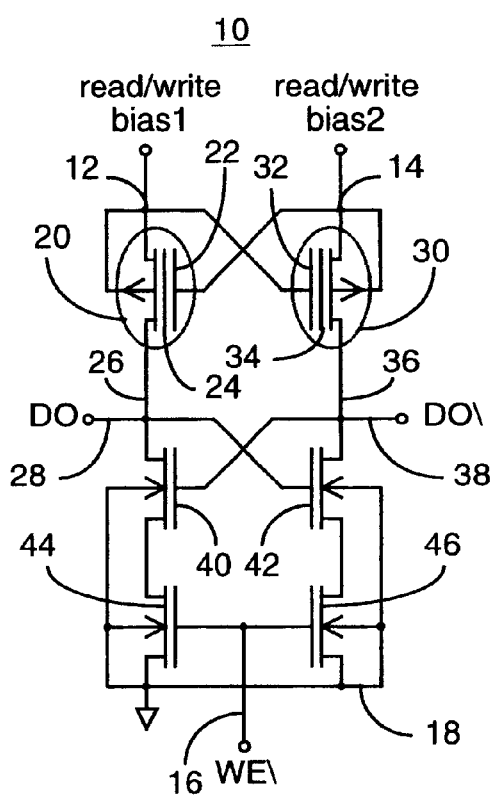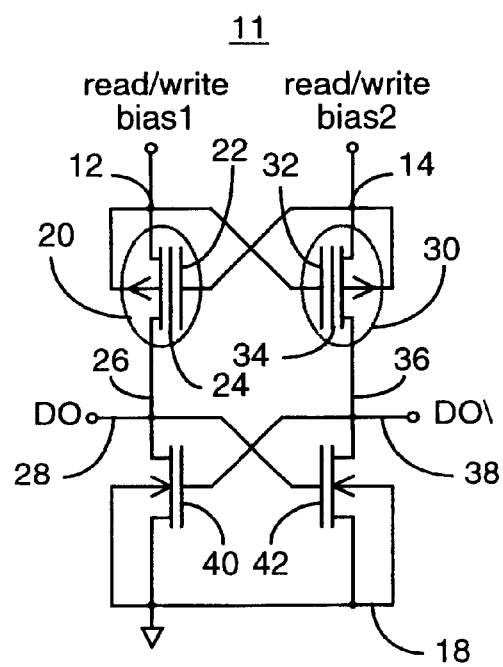
Figure 1A
Figure 1B

NON-VOLATILE LATCH

CROSS-REFERENCE TO RELATED APPLICATION

The present application claims the benefit of the date of U.S. Provisional Patent Application Ser. No. 60/166,593, entitled "Non-Volatile Latch", filed on Nov. 19, 1999, which is incorporated by reference herein in its entirety.

BACKGROUND OF THE INVENTION

1. Field of the Invention

The present invention relates generally to semiconductor devices. In particular, the present invention relates to a non-volatile latch.

2. The Prior Art

Rewritable, nonvolatile latches are useful for storing small amounts of data which should be stored when the power is disconnected from the circuit and then easily accessed without the necessity of employing sense amplifiers and, often, addressing circuitry. Examples of these applications are trimming of analog circuits, circuit ID information, or storage of addresses in redundancy repair. Because of the utility of a rewritable, nonvolatile latch, there have been a number of these devices developed over the years.

For example, a nonvolatile latch is disclosed in U.S. Pat. No. 4,113,904 to Harari. The latch of Harari has the drawback that the data read back is the complement of the data written into the cell. A noninverting latch circuit to overcome this drawback was disclosed in U.S. Pat. No. 4,348,745 to Schmitz. The Schmitz design has the drawback that it requires 12 transistors. Schmitz also suggests the application of 17 V for the write operation.

A rewritable, nonvolatile CMOS latch that can be fabricated with a single layer of polysilicon is disclosed in U.S. Pat. No. 4,858,185 to Kowshik and Lucero. The latch of Kowshik and Lucero requires only six transistors, two tunnel oxide capacitors, and two coupling capacitors. The process for fabricating the Kowshik and Lucero device requires the formation of separate buried n+ regions in addition to the thin tunnel oxide regions.

Yet another latch is disclosed in U.S. Pat. No. 5,097,449 to Cuevas. The Cuevas disclosure contains the provision that the data is stored on redundant nonvolatile memory elements for added reliability. Achieving this improvement in reliability requires the use of 10 transistors and 2 tunneling capacitors as well as the buried n+ regions used by Kowshik and Lucero.

A rewritable, nonvolatile latch that is programmed by electrons generated by band-to-band tunneling and cleared by tunneling from the floating gate to the well is disclosed in U.S. Pat. No. 5,781,471 to Kowshik and Yu. The Kowshik and Yu cell requires only six transistors in the latch, but requires both positive and negative high voltage for writing and also requires a separate clear operation before the data can be entered into the memory.

Rewritable, nonvolatile latches are typically employed in applications in which only a small amount of nonvolatile memory is in conjunction with other circuitry. In these applications, it is important that the nonvolatile latch requires as few additional process steps as possible and that the peripheral circuitry required to write to and read from the latch be as simple as possible so as to minimize the cost of the nonvolatile latch. Hence, there exists a need for a simple nonvolatile latch that requires a small number of transistors and a minimum number of extra process steps, and that can be written into a new state by applying a modest unipolar voltage to the latch.

BRIEF DESCRIPTION OF THE INVENTION

A non-volatile latch according to the present invention employs a pair of transistors, each with a floating gate that is capacitively coupled to the source of the paired transistor. The drains of the floating gate transistors are connected to the drains of another pair of transistors of opposite channel type; the gates of the second pair of transistors are cross coupled to the drains of the opposing members of the pair. A third pair of transistors is arranged so that one member of the pair is in series with the channels of the each of the sets of series connected n-channel and p-channel transistors. The gates of the third pair of transistors is biased so that current is blocked from flowing through the transistor channel during write and is allowed to flow through the channels during the read operation.

Data is written into the latch by applying a moderate high voltage to the source and well of one of the pair of floating gate transistors while the source and well of the other member of the pair is biased at ground. This bias causes electrons to tunnel from the floating gate to the channel region on one of the pair and from the channel region to the floating gate on the other of the pair; this current flow leaves one of the floating gates charged positive and the other charged negative.

The sources and wells of the floating gate transistors are biased at the same potential during read. As bias is applied across the CMOS inverters formed by the series connected n-channel and p-channel transistors, one floating gate transistor begins to conduct before the other with the result that the cross coupled inverters latch into a state in which one inverter is set high and the other is set low.

The result is that this configuration forms a latch that consumes only leakage current in both read and write modes. Because of the symmetry, a single write bias condition is sufficient to charge one floating gate while discharging the other.

Other objects, features and advantages of the present invention will be understood and appreciated be reference to the detailed descriptions provided below which should be considered in conjunction with the accompanying drawings.

BRIEF DESCRIPTION OF THE DRAWING FIGURES

FIGS. 1A and 1B are electrical schematic drawings of two different configurations of a non-volatile latch in accordance with the present invention.

DETAILED DESCRIPTION OF PREFERRED EMBODIMENTS

Figure 2B:
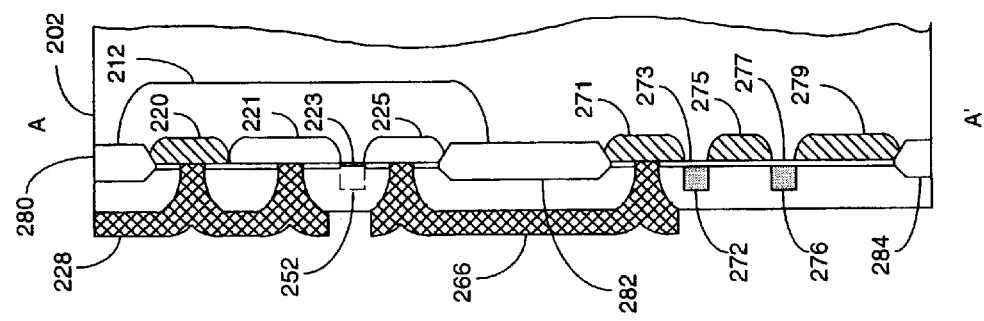
FIGS. 2A and 2B are, respectively, top and cross-sectional drawings depicting schematically the physical realization of one embodiment of the present invention.

Persons of ordinary skill in the art will realize that the following description of the present invention is illustrative only and not in any way limiting. Other embodiments of the invention will readily suggest themselves to such skilled persons having the benefit of this disclosure.

FIGS. 1A and 1B are schematic diagrams of two circuits according to the present invention. Referring first to circuit 10 of FIG. 1A, circuit 10 includes a pair of p-channel transistors 20 and 30 that have floating gates 24 and 34, respectively. Transistors 20 and 30 also have control gates 22 and 32 that are capacitively coupled to the floating gates 24 and 34, respectively. The control gates are each connected to the well of the paired transistors. The source of each floating gate transistor is connected to its own n-well.

In an exemplary non-limiting embodiment of the present invention, the gate oxide of these transistors is chosen to be thin enough to allow Fowler-Nordheim tunneling to occur between the floating gate and the channel with the application of modest high voltages. In a preferred embodiment of the present invention, the preferred gate oxide thickness is in the range 8–11 nm although thicker oxides can be used with higher applied write voltages and thinner oxides can be used at the expense of long term charge retention as is known to those with ordinary skill in the art.

The drains of the transistors 20 and 30 in circuit 10 are connected to the drains of a pair of n-channel transistors 40 and 42, respectively. The gate of transistor 42 is connected to the drain of transistor 40 while the gate of 40 is connected to the drain of 42 in a cross-couple arrangement. The outputs of the latch 28 and 38 are taken from the drain connections of the n-channel and p-channel transistors. A pair of n-channel transistors 44 and 46 have their drains connected to the sources of transistors 40 and 42, respectively. The sources of the pair 44 and 46 are connected to VSS and the gates are connected to the complement of the write signal, WE\ 16.

Referring now to the operation of the latch of circuit 10, to write a value into this latch, WE\ is biased at VSS and then one of the read/write bias nodes 12 and 14 is biased at VPP with the other biased at ground, i.e. VSS. Depending on the coupling ratio between the control gate and the floating gate (i.e. the ratio of the floating gate to the control gate to the total capacitance of the floating gate) and the tunnel oxide thickness, VPP can be as low as 10 V. The margin of the latch can be improved by increasing the magnitude of VPP. This voltage is preferably in the range of about 10–14 V to ease the requirements on the high voltage transistors, although it is well known to those of ordinary skill in the art that higher voltages can be applied at the cost of providing and managing higher voltages since voltages in the range of 20 V or greater were common for early nonvolatile circuits. It is also known to those of ordinary skill in the art that the value of the programming voltage can be reduced to as little as 8 V by increasing the programming time, thinning the tunnel oxide, increasing the coupling ratio and reducing the stored voltage margin.

To store a configuration into the latch of circuit 10 such that the node 26 is high in the read mode, VPP would be applied to the node 14 while the read/write bias nodes 12 and 16 are biased to VSS. With node 16 biased at ground the n-channel, enhancement transistors 44 and 46 are nonconducting so that there is no current flow between read/write bias node 14 at VPP and node 18. This is important because with read/write bias node 12 biased at VSS, the control gate 32 of transistor 30 is at ground which capacitively couples the floating gate 34 to a voltage near ground biases the channel of transistor 30 into inversion so that transistor 30 is conducting. As the circuit is configured, the node 36 is charged to VPP and the complete channel is at VPP potential. This potential causes electrons to tunnel from floating gate 34 to the channel leaving the gate positively charged.

At the same time, the positive bias on the control gate 22 is capacitively coupled to the floating gate 24. This causes electrons to tunnel from the grounded n-well of transistor 20 to an uncharged floating gate. At the end of the write pulse, the floating gate 24 is charged negative and the floating gate 34 is charged positively.

After the write pulse, both n-wells are returned to the normal read bias, VDD, as is the node 16. Because both control gates are tied to the, now common, source potential for the p-channel transistors, the transistor with the floating gate charged positive will not conduct and the transistor with the floating gate charged negative will conduct. In the example discussed above, transistor 20 is conducting and transistor 30 is nonconducting. The current flowing through transistor 20 charges node 28 positively which biases transistor 42 into a conductive state. Since transistors 46 and 42 are biased into conducting states and transistor 30 is not conducting, node 36 is held at ground. This ensures that transistor 40 is not conducting so that transistor 20 can charge node 28 to the full VDD level. Had the floating gates been charged to the opposite states by reversing the write pulses, the output state in read mode would be inverted.

Although the state written into the latch can be read by returning both the bit and bit\ signals, 12 and 14, to VDD as long as the floating gates are charged sufficiently strongly, the latch can detect much smaller differences in charges on the floating gates by pulsing the two read/write bias nodes 12 and 14 to ground before gradually, e.g. over a period of 100 ns, returning them to VDD. This is the preferred mode of operation.

Thus, in the read mode, the latch provides full level complementary outputs levels without any current flow except for transistor leakage. In the write mode, the transistors 44 and 46 are biased off to assure that there are no DC current paths through the circuit. The currents flowing in the circuit are only those required for charging the capacitances, including charging the floating gate capacitance through Fowler-Nordheim tunneling and the leakage currents of the transistor source/drain junctions. Because there are no significant voltage differences between the source and drain of either transistor 20 or 30, there are few hot carriers generated to add to the write current. This allows the high voltages needed for writing to be generated with small on-chip charge pumps.

Figure 2A:
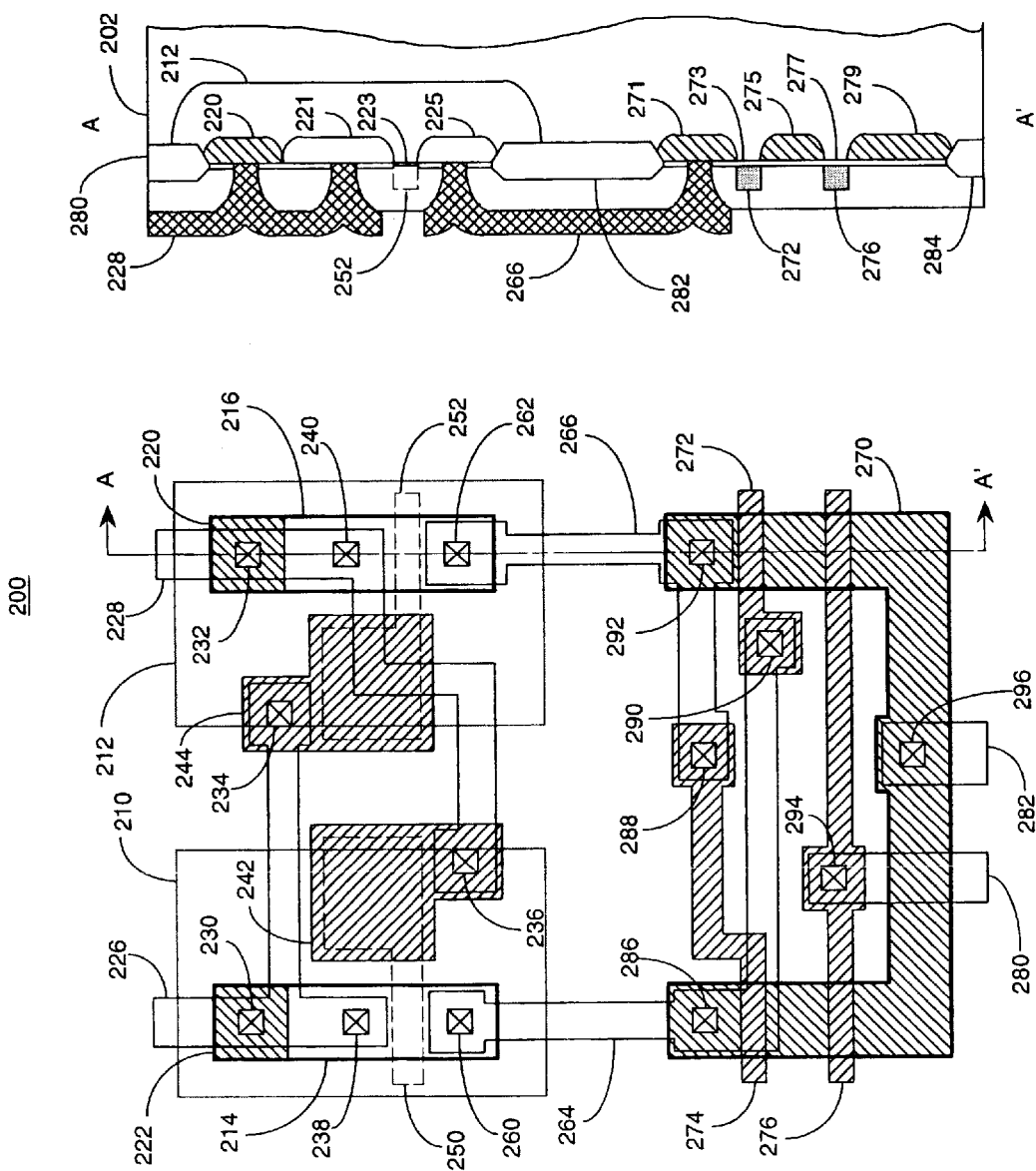

FIGS. 2A and 2B, respectively, show a top view and a cross-sectional view of one implementation of the circuit 10. The cross section of FIG. 2B is taken along the section A–A' indicated by the long/short dash line in FIG. 2A. The regions enclosed by the broken lines 210 and 212 are n-wells formed in a p-type region. The regions 214, 216, and 270 enclosed by heavy lines are thin oxide "active" regions that are surrounded by thick oxide "field" regions that provide isolation for the circuit elements. Portions of the thick field oxide are seen as regions 280, 282, and 284 in the cross-section.

There are two structure 250 and 252 that are formed of a first layer of polysilicon. These structure are separated from the underlying active regions by thin oxide layers, preferably 8–11 nm in thickness. One of these thin oxide regions is seen as the region 223 in the cross-section. The structures 250 and 252 form the floating gate electrodes. The portions of the active regions not covered by polysilicon are doped either heavily p-type, p+, or heavily n-type, n+. The portions of the active regions that are doped n+ are cross shaded from upper right to lower left. The unshaded active regions not covered by polysilicon are doped p+. Thus the regions 221 and 225 seen in the cross-section of FIG. 1 form, respectively, the source and drain of floating gate transistor 30 shown in FIG. 1. The polysilicon region 252 forms the gate electrode of this transistor. The n+ doped region 220 allows contact to the n-well 212 of this transistor.

Metal regions are enclosed by light weight, solid lines in the top view and as cross-hatched regions in the cross-section. Regions 226, 228, 264, 266, 280 and 282 are metal regions. The second layer of polysilicon is indicated by regions enclosed by a light weight solid line that are cross shaded from upper left to lower right. Regions from which insulating layers are removed to allow contact between metal and poly or between metal and doped diffusion regions are indicated by squares with crosses in the top view. Regions 230, 232, 234 and 236 are examples of contact regions.

A dielectric layer is formed to separate the first and second layers of polysilicon so that a capacitor is formed in the regions in which poly 2 overlaps poly 1. This layer is optimized in one of several ways well-known to those of ordinary skill in the art so that the charge leakage between the polysilicon layers is very low, but the capacitance per unit of overlap area is reasonably high.

Thus, as shown in FIGS. 2A and 2B, the poly 2 region 244 is capacitively coupled to the poly 1 floating gate electrode 252 to form a control gate for transistor 30. Transistor 20 is formed in a manner analogous to transistor 30 in the region where poly 1 region 250 overlies active region 214. Contact openings 232, 236, and 240 allow metal trace 228 to contact the select gate 242, the source region 221 and the n+ well tap region 220 and connect them together to the bit\ signal. Contact openings 230, 234, and 238 perform and analogous function with metal trace 226.

Transistor 40 is formed in the region where poly 2 trace 274 crosses active region 270; transistor 42 is formed n the region where poly 2 trace crosses active region 270. Poly 2 trace 276 crosses active region 270 and forms transistors 44 and 46. Metal traces 264 and 266 join the sources of transistors 20 and 30 to the drains of transistors 44 and 46, respectively, through the contact holes 260, 262, 286, and 292. They also continue on to contact the poly 2 traces 272 and 274 so that the transistor gates are connected to the opposite drains. Finally, metal trace 280 carries the signal WE\ to the gates of the transistors 44 and 46 through the contact opening 294 and the metal trace 282 provides a ground connect to the active region 270 through the contact opening 296.

Analysis shows that transistors 44 and 46 may not be necessary. Consider circuit 11 in FIG. 1B. The elements that are the same as in circuit 10 of FIG. 1A are given the same reference numerals in FIG. 1B. The difference between the two circuits 10 and 11 is that transistors 44 and 46 are omitted from circuit 11 in FIG. 1B. Assume that read/write bias node 14 is to be pulsed to VPP and node 12 biased at VSS to charge the floating gate of transistor 30 positive and the floating gate of transistor 20 negative. Let read/write bias node 12 be biased at VSS while node 14 is biased at VDD, the operating power supply level. Since the n-well containing the transistor 20 is tied to the node 12, the drain of the transistor 20 can be no higher than one pn diode drop, approximately 0.6 V, above ground because a more positive voltage would forward bias the diode formed by the p+ source diffusion in n-well. This low bias voltage will render transistor at most weakly conductive. If the threshold of transistor 30 is more positive than −VDD, this transistor will conduct which charges node 36 positive. As soon as the bias on node 36 approaches the threshold of the transistor 40, this transistor will begin to conduct which will further reduce the bias on the gate of transistor 42 and, hence, reduce its conductivity further. This is a positive feedback loop that quickly reduces the bias of node 26 to zero and shuts transistor 42 completely off. Even if the threshold of transistor 30 is initially more negative than −VDD, as soon as this transistor begins to conduct with the increase of its source voltage for the writing operation, this "virtuous" feedback loop will come into play and quickly eliminate any DC current paths. A corresponding analysis applies if the latch is to be written to the logical complement state. Therefore, the transistors 44 and 46 can be eliminated and the latch can operate with only four transistors.

A limitation of circuits 10 and 11 in some applications is that the outputs 29 and 38 may have VPP applied to them during the write operation which bars the direct connection of these nodes to the gates of submicron scale CMOS transistors that have gate oxide too thin to withstand this bias. There are a number of solutions to this problem. One solution is to insert an inverter composed of high voltage transistors between the latch output and the low voltage circuits. Another solution is to insert an n-channel pass transistor with its gate biased at VDD in the path between the latch and the sensitive circuitry.

Figure 3:
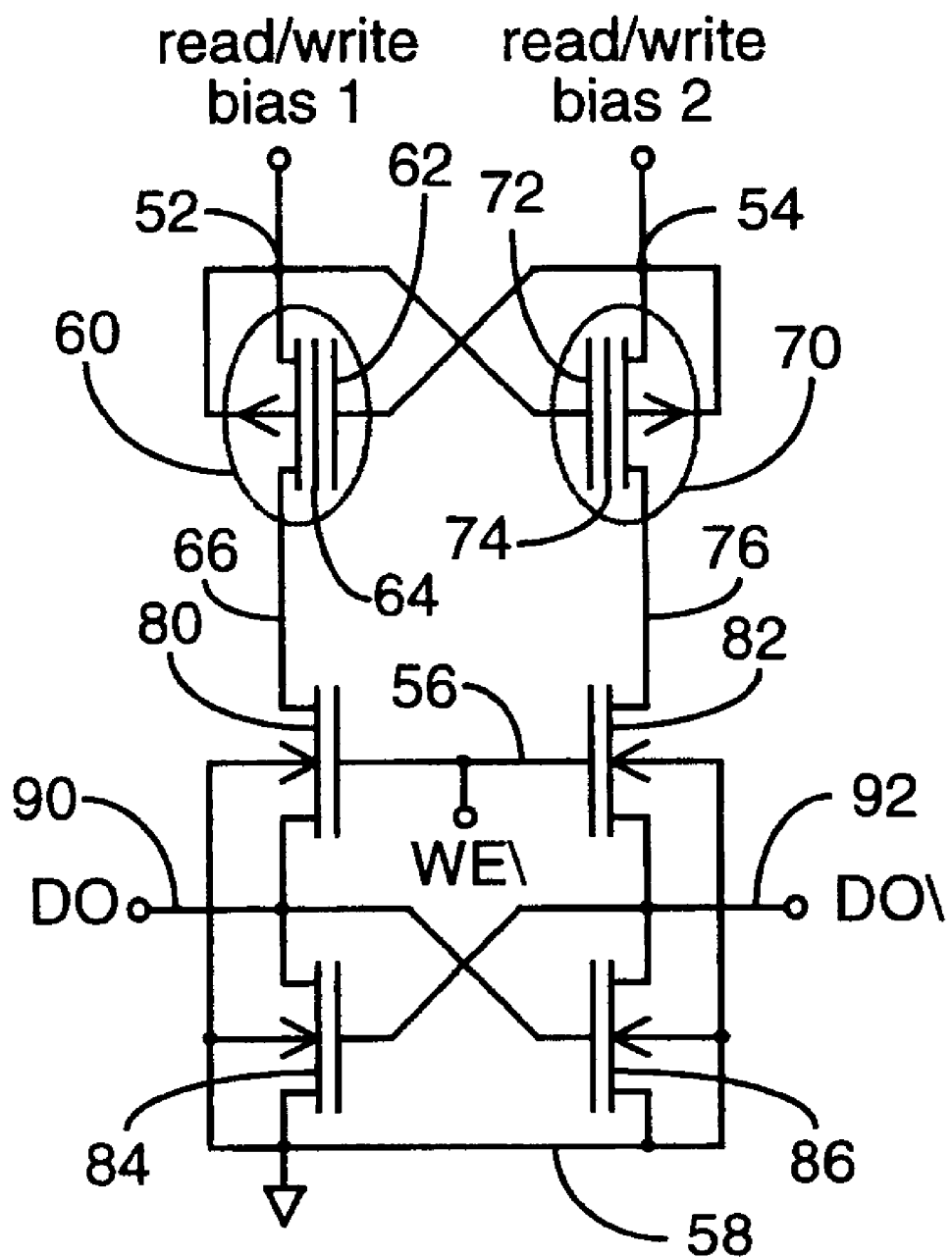
FIG. 3 is a schematic drawing showing another embodiment of a non-volatile latch in accordance with the present invention.

Another solution is to include two pass transistors within the latch as is shown schematically in FIG. 3 as circuit 50. If the circuit 50 is compared with the circuit 10, it becomes clear that the floating gate transistors are arranged in the same manner in both circuits. However, the transistors whose gates are driven by the signal WE\ are moved so that they are connected in series between the p-channel floating gate devices and the cross coupled n-channel pull down transistors in circuit 50 rather than between the cross coupled n-channel pull down transistors and ground in circuit 10. As arranged in FIG. 3, they still provide the function of preventing DC current flow during the write operation, but, additionally, they serve to isolate the outputs 90 and 92 from the high VPP voltage applied during the write operation.

Although the node 56 that drive the gates of transistors 80 and 82 in circuit 50 is shown as being driven by the complement of the write enable signal, WE\, the function of isolating the outputs 90 and 92 from the high voltages applied during writing in FIG. 3 could also be accomplished by biasing the node 56 at the level of the power supply VDD. Whether node 56 is biased at continuously VDD or driven to VDD during read by the WE\ signal, the high level on the outputs will be reduced by the threshold voltage of the transistors 80 and 82. However, in many cases a "zero" threshold n-channel transistor is available in the technology and may be employed so that the high level is reduced by only a couple of hundred millivolts.

In the embodiments discussed so far in this disclosure, poly-to-poly capacitors are used to provide capacitive coupling of potentials onto the floating gates. However, other low leakage capacitors such as the "MOS" capacitors between a polysilicon gate and doped regions in the silicon substrate may also provide this function. In some applications, the MOS capacitor may be the preferred choice because it does not require a second layer of polysilicon be available in the process.

Figure 4A:
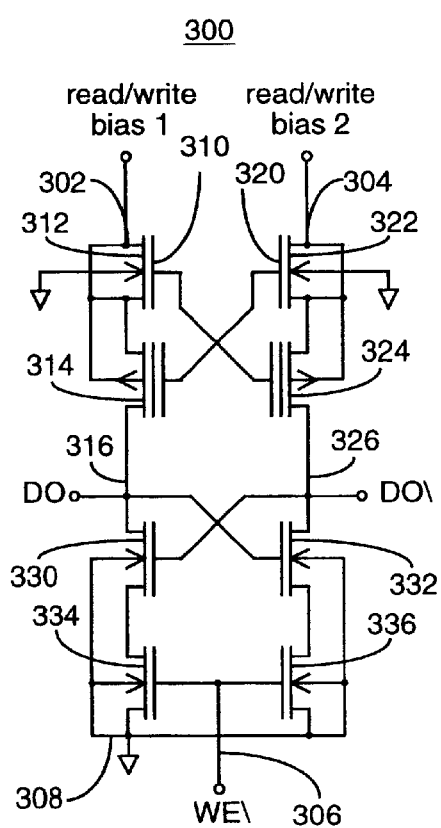
FIG. 4A and 4B are electrical schematic drawings of two additional configurations of a non-volatile latch in accordance with the present invention.
Figure 4B:
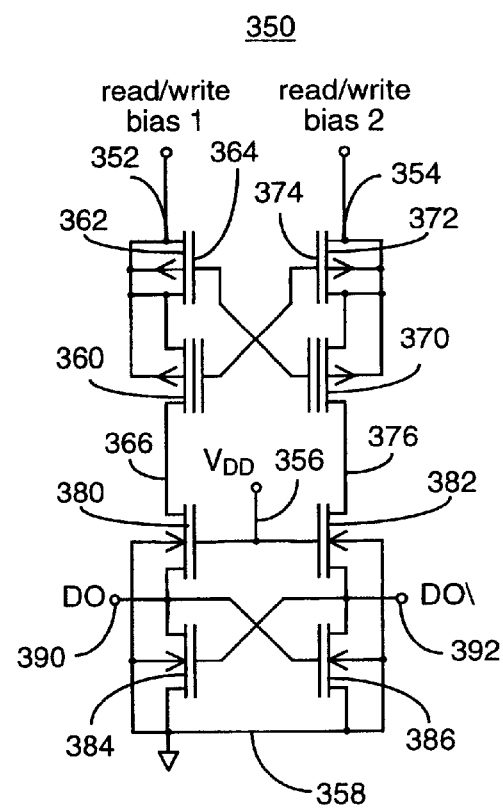

FIGS. 4A and 4B show two circuit embodiments of the present invention that employ MOS coupling capacitors to the floating gates. In circuit 300 of FIG. 4A, n-type capacitors 312 and 322 are used to provide coupling to the floating gates 310 and 320, respectively. For proper operation of this circuit with the p-wells grounded, the thresholds of the capacitors 312 and 322 must be $\leq$-VPP.

Another embodiment of MOS capacitors is shown in circuit 350 of FIG. 4B. In this circuit PMOS capacitors 362 and 372 provide capacitive coupling to floating gates 360 and 370, respectively. Because these capacitors share the same n-well as the floating gate transistors 364 and 374, common enhancement type capacitors can be used. These capacitors can also have the same gate oxide thickness as the floating gate transistors 364 and 374 for improved coupling. Comparison of circuit 350 in FIG. 4B and 50 in FIG. 3 shows that they are in exact correspondence in the portion that lies below the floating gate transistors with the exception that, as was suggested above, node 356 is connected to VDD in circuit 350 whereas node 56 is connected to WE\ in circuit 50. The floating gate transistors 360 and 370 in circuit 350 have the same connectivity and serve the same functions as the transistors 60 and 70 in circuit 50.

The only significant difference in the two circuits is that the polysilicon control gates 62 and 72 in circuit 50 are replace with the silicon side of MOS capacitors 362 and 372 in circuit 350. The MOS capacitors, however, perform essentially the same functions as the poly to poly capacitors. Consider a write event in which the read/write bias node 354 is pulsed to VPP while the read/write bias node 352 is biased at ground. The capacitance of the MOS capacitor 362 keeps floating gate 364 coupled to a low potential which causes electrons to tunnel from the floating gate to the inversion layer in the channel of transistor 370. Similarly, the capacitance of MOS capacitor 372 causes the floating gate 374 to couple to a high potential so that electrons tunnel from the accumulated channel region of transistor 360 to tits floating gate.

Figures 5A, 5B:
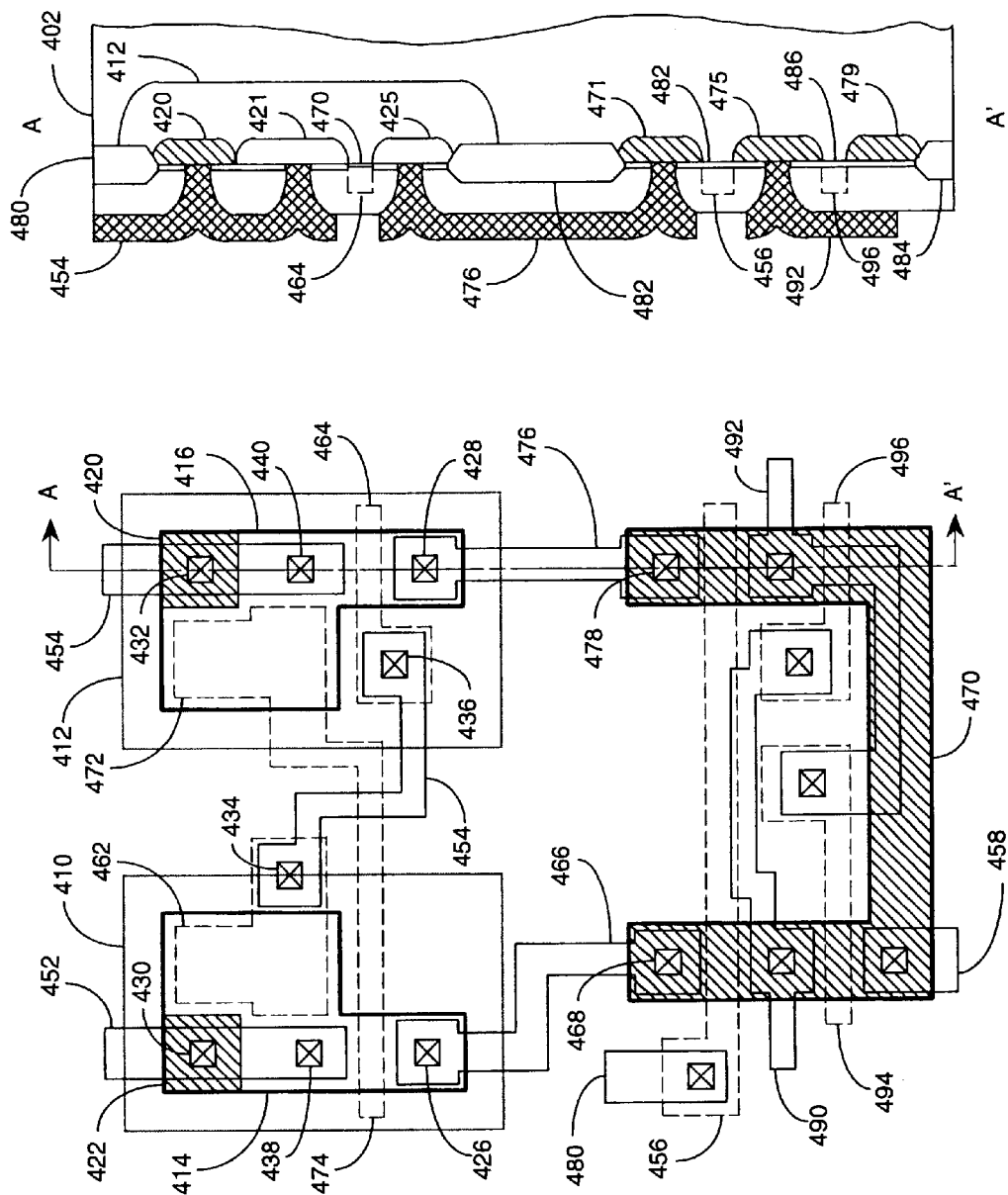
FIGS. 5A and 5B are, respectively, top and cross-sectional drawings depicting schematically the physical realization of the circuit depicted in FIG. 4.

A physical realization of the circuit depicted in the electrical schematic 350 of FIG. 4B is depicted in FIGS. 5A and 5B. The conventions for regions in FIGS. 5A and 5B are the same as in FIGS. 2A and 2B. Notice that only the first layer of polysilicon is employed in this layout. The cross coupled, n-channel transistors 494 and 496 in the circuit 350 are formed in the regions where the poly silicon traces 494 and 496, respectively, cross the active region 470. The transistor 486 formed where the poly trace 496 lies between the n+ doped source region 479 and the n+ doped drain region 475 is indicated in cross section A–A'. The transistors 380 and 382 are formed where the poly trace 456 crosses the active region 470. The same metal traces 490 and 492 that provide the cross couple connection between the polysilicon traces 494 and 496 to the opposing drain junction also provide the output signal races indicated as 390 and 392 in the circuit schematic 350. In the cross section drawing A–A' the location of the transistor 482 is indicated where the poly trace 456 lies between the n+ junction region 475 which acts as the source of transistor 482 and the junction region 471 which acts as the transistors drain. The region where the metal trace 492 contacts the junction region 475 can also be seen in the cross section.

The p-channel, floating gate, pull up transistors 460 and 470 are formed where the poly trace 474 crosses the active region 414 and where the poly trace 464 crosses the active region 416, respectively. The metal traces 466 and 476 and provide connection between the floating gate pull up transistors and the n-channel, pull down transistors via the four contacts 426, 428, 460, and 462.

The two MOS coupling capacitors 362 and 372 are formed where the polysilicon regions 462 and 472 overlie the active regions 414 and 416, respectively. All of the gate oxides in the n-wells 410 and 412 are preferably of a thickness suitable for the use as a tunnel oxide, preferably in the range of thickness 7–11 nm. The gate oxides under at least the poly trace 456 should be thick enough to reliably withstand the high voltages used to write to the latch. In the cross section, the thin gate oxide of the transistor 470 formed where the poly trace 464 lies between the p+ junctions 425 and 421 can be seen. This drawing also indicates that the gate oxides under the traces 456 and 496 are thicker than that oxide under the trace 464. This will be true in most cases, but by judicious choice of the bias applied to the trace 456 during writing and clever circuit design in the peripheral circuitry it may be possible to use the same thickness gate oxide for all these transistors. In the case of coupling capacitor 372, the poly region forming the plate is a continuation of the poly trace 474 that forms transistor 360. In the case of the MOS capacitor 362, its poly plate 462 is connected to the poly trace 464 that forms transistor 370 by the metal trace 454 via the contacts 434 and 436. The n-well taps, floating gate drain contacts and traces leading to the signals 352 and 254 are similar to those describes with respect to FIGS. 2A and 2B.

Figure 6:
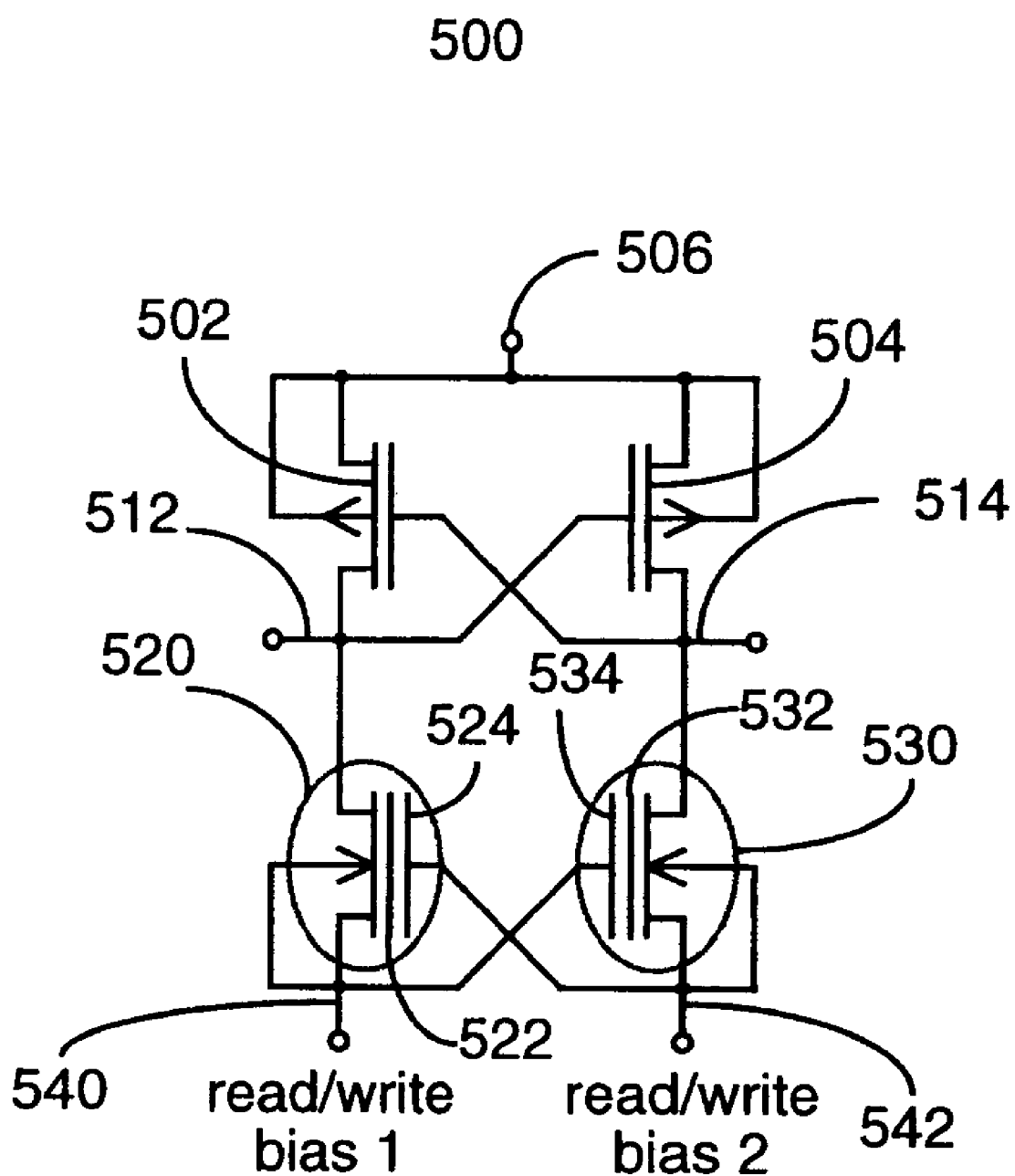
FIG. 6 is an electrical schematic of an embodiment of this invention in which the memory elements are n-channel floating gate transistors fabricated in p-wells.

All of the circuits described so far have employed floating gate, p-channel transistors formed in n-wells as the memory elements. However, this invention is not limited to such implementations. FIG. 6 shows an electrical schematic of an embodiment of this invention in which the memory elements are n-channel floating gate transistors fabricated in p-wells. The key issue is that this embodiment requires that the p-wells be electrically isolated. Modern CMOS circuits are commonly fabricated on p-type substrates. In this case, isolated p-wells requires a triple well process in which the active p-wells are formed within n-wells formed in the p-type substrate. However, it is possible to fabricate CMOS integrated circuits starting with n-type substrates. Indeed, most early CMOS circuits were formed in this manner. Alternately, in one of several technologies in which the active wells are dielectrically isolated from each other, such as silicon on insulator, well of both types are electrically isolated and its become a matter of choice which well type is selected for the floating gate memory transistors.

To write a state into the latch depicted in FIG. 6, the read/write bias node 542 would first be pulsed to VDD while node 506 remains biased at VDD and read/write bias node 540 biased at ground. This causes the node 514 to be charged to a potential $\geq$(VDD–Vpn) where Vpn is the voltage drop across a pn diode and, consequently a very small current will flow through transistor 502. There is no DC current flow through the inverter comprised of transistors 504 and 530 because the sources of the n-channel and p-channel transistor are at the same potential. Then nodes 506 and 542 are pulsed to VPP. When this occurs, the field between the accumulated channel region of the transistor 530 and the floating gate 532, which is capacitively coupled to a low potential by the control gate 534 that is biased at ground, causes electrons to tunnel from the floating gate to the channel region. At the same time the floating gate 522 is capacitively coupled high enough by the control gate 524 to cause electrons to tunnel from the inverted channel of transistor 520 to its floating gate 522. The opposite state can be written by reversing the potentials on read/write bias nodes 540 and 542.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A non-volatile latch comprising:

first and second read/write bias nodes;

first and second complementary output nodes;

first and second first conductivity type MOS transistors having sources coupled to a first voltage potential, a drain of said first MOS transistor coupled to said first complementary output node and a drain of said second MOS transistor coupled to said second complementary output node, each of said first and second MOS transistors having a gate cross coupled to the drain of the other one of said first and second MOS transistor; and third and fourth second conductivity type MOS floating gate transistors, a source of said third MOS transistor coupled to said first read/write bias node and a source of said fourth MOS transistor coupled to said second read/write bias node, a drain of said third MOS transistor coupled to said first complementary output node and a drain of said fourth MOS transistor coupled to said second complementary output node, each of said third and fourth MOS transistors having a gate cross coupled to the source of the other one of said third and fourth MOS transistors.

2. The non-volatile latch of claim 1 wherein said sources of said first and second MOS transistors are respectively coupled to said first voltage potential through first and second switching transistors having gates coupled to a common switch line.

3. The non-volatile latch of claim 1 wherein said drains of said third and fourth MOS transistors are respectively coupled to said first and second complementary output nodes through first and second switching transistors having gates coupled to a common switch line.

4. The non-volatile latch of claim 1 wherein said gates of said third and fourth MOS transistors are cross coupled to the source of the other one of said third and fourth MOS transistors through capacitors.

5. The non-volatile latch of claim 4 wherein said drains of said third and fourth MOS transistors are respectively coupled to said first and second complementary output nodes through first and second switching transistors having gates coupled to a common switch line.

\* \* \* \* \*